United States Patent
Savignac et al.

(10) Patent No.: US 6,317,378 B1
(45) Date of Patent: Nov. 13, 2001

(54) BUFFER CIRCUIT

(75) Inventors: Dominique Savignac, Ismaning; Robert Feurle, Neubiberg; Helmut Schneider, München, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/592,225

(22) Filed: Jun. 12, 2000

Related U.S. Application Data

(63) Continuation of application No. PCT/DE98/03268, filed on Nov. 9, 1998.

(30) Foreign Application Priority Data

Dec. 11, 1997 (DE) .............................................. 197 55 130

(51) Int. Cl.$^7$ ................... G11C 5/14; G05F 1/40
(52) U.S. Cl. ............................................ 365/226; 323/281
(58) Field of Search .................... 323/270, 273, 323/275, 279, 281; 365/189.05, 189.09, 226; 327/534, 535, 538, 544

(56) References Cited

U.S. PATENT DOCUMENTS

| | | | |
|---|---|---|---|
| 4,585,956 | * | 4/1986 | Lie .......................................... 307/353 |
| 5,030,848 | | 7/1991 | Wyatt . |
| 5,276,651 | * | 1/1994 | Sakamoto ............................. 365/226 |
| 5,422,591 | | 6/1995 | Rastegar et al. . |
| 5,744,982 | * | 4/1998 | Chu ....................................... 326/83 |

FOREIGN PATENT DOCUMENTS

| | | |
|---|---|---|
| 0310359A2 | 4/1989 | (EP) . |
| 0317222A2 | 5/1989 | (EP) . |
| 6-215570 | 8/1994 | (JP) . |
| 247 975 | 3/1988 | (TW) . |

OTHER PUBLICATIONS

"Active Equivalent Series Resistance Filter", IBM Technical Disclosure Bulletin, vol. 14, No. 2, Jul. 1971, pp. 523.

* cited by examiner

Primary Examiner—Matthew Nguyen
(74) Attorney, Agent, or Firm—Herbert L. Lerner; Laurence A. Greenberg; Werner H. Stemer

(57) ABSTRACT

A buffer circuit serves for buffering a supply voltage of an integrated circuit. The supply voltage is present between two potential nodes. A series circuit is disposed between the two potential nodes and includes at least two buffer capacitors between which a third potential node is disposed. The third potential node is connected to an additional circuit which influences the potential of the third potential node in such a way that it does not exceed an upper and/or lower limit value when a leakage current occurs through one of the capacitors. The advantage of the buffer circuit is that when there is a defect in just one of the buffer capacitors, the other capacitor is prevented from being destroyed.

10 Claims, 2 Drawing Sheets

BUFFER CIRCUIT

CROSS-REFERENCE TO RELATED APPLICATION

This application is a continuation of copending International Application No. PCT/DE98/03268, filed Nov. 9, 1998, which designated the United States.

BACKGROUND OF THE INVENTION

Field of the Invention

The invention relates to a buffer circuit for buffering a supply voltage of an integrated circuit.

Such buffer circuits usually contain capacitors for buffering the voltage. If the capacitor has a defect, that is to say an undesirable leakage current flows through it, the buffer circuit can no longer fulfill its function. That is because the defective capacitor then causes a collapse of the voltage to be buffered. In the text below, a defect in a capacitor is understood to mean a state in which a current flow occurs between the two electrodes of the capacitor. Such a defect may be caused, for example, by production faults or by overvoltages occurring during subsequent operation with the consequence of damage to the dielectric of the capacitor.

Summary of the Invention

It is accordingly an object of the invention to provide a buffer circuit for a supply voltage of an integrated circuit, which overcomes the hereinafore-mentioned disadvantages of the heretofore-known devices of this general type and which has a large tolerance with respect to defects of buffer capacitors contained in the buffer circuit.

With the foregoing and other objects in view there is provided, in accordance with the invention, a buffer circuit for buffering a supply voltage of an integrated circuit, comprising two potential nodes between which a supply voltage drops; a series circuit disposed between the two potential nodes, the series circuit having at least two buffer capacitors and a third potential node disposed between the buffer capacitors; and an additional circuit connected to the third potential node for influencing a potential at the third potential node to not exceed an upper and/or a lower limit value upon occurrence of a leakage current through one of the capacitors.

The series circuit which is formed by two capacitors for buffering the supply voltage makes it possible to buffer a higher voltage than would be possible with just one of the two capacitors. Without the additional circuit according to the invention, in the event of a defect in one of the two buffer capacitors, due to the voltage dip associated therewith, a very high voltage would be dropped across the still intact second capacitor. In many cases that would result in even the second capacitor being destroyed, with the result that a short-circuit current would then flow through both capacitors. The supply voltage to be buffered would collapse in that case.

The additional circuit according to the invention ensures that the potential between the two buffer capacitors, in the event of a defect in one of the capacitors, is not solely dependent on the short-circuit resistance thereof, but also additionally on the additional circuit. The effect that is achieved due to the limitation of the changes in the potential at the third potential node which occur in the event of defects is that the level of the voltage dropped across the still intact capacitor likewise remains limited. Field strengths which could cause the destruction of the still intact capacitor are avoided in this way. Consequently, in an advantageous manner, the buffer circuit remains at least partially effective even if one of the two buffer capacitors is defective, and without the supply voltage to be buffered collapsing due to a short circuit through both capacitors of the buffer circuit.

In accordance with a first embodiment of the invention, the additional circuit has a resistance element, through which the third potential node is connected to an essentially constant potential. The potential at the third potential node then corresponds, in the case of intact buffer capacitors, essentially to the constant potential. If one of the buffer capacitors is defective, the potential at the third potential node is determined in a manner dependent on the voltage divider ratio which is formed by the resistance element and the short-circuit resistance of the defective buffer capacitor. The value of the resistance element should be dimensioned correspondingly, so that the potential at the third potential node varies only within the desired limits when a defect occurs. In this case, the resistance element is dimensioned with reference to short-circuit resistances which are typical of the capacitors used when a defect is present.

If the two buffer capacitors are dimensioned identically, it is advantageous to place the value of the constant potential exactly in the middle between the potentials at the first and second potential nodes. In that case, given an intact buffer circuit, half of the supply voltage to be buffered is dropped across each of the buffer capacitors and no current flows through the resistance element.

The high-value resistance element may be realized, for example, by a non-reactive resistor, by a diode or by a transistor connected as a resistor.

In accordance with a further feature of the invention, the resistance of the high-value resistance element can be adjusted through the use of a voltage regulator which regulates the potential of the third potential node in this way, in such a way that it does not exceed the upper and/or lower limit values. This affords the advantage over a solution with a non-adjustable resistance element of permitting the potential at the third potential node to be kept stable for the extremely varied short-circuit resistances of the defective capacitor.

In accordance with an added feature of the invention, the additional circuit has a voltage divider which is disposed between fourth and fifth potential nodes and across which an essentially constant voltage is dropped, and the voltage divider has two resistance elements between which a sixth potential node connected to the third potential node isdisposed.

In accordance with an additional feature of the invention, the fourth potential node is connected to the first potential node and the fifth potential node is connected to the second potential node. In that case, the constant voltage dropped across the voltage divider is identical to the supply voltage to be buffered, and a further constant voltage is not required.

In accordance with a concomitant feature of the invention, it is particularly favorable if at least one, but preferably both, of the resistance elements of the voltage divider have variable resistances. Corresponding control inputs of the resistance elements are connected to a voltage regulator which regulates the potential at the third potential node through the resistance elements.

The embodiments of the invention that have been outlined, in which the additional circuit has a voltage regulator, have the major advantage of allowing the potential at the third potential node to be predetermined with a high degree of accuracy in the event of a defect in one of the buffer capacitors. The adaptation of the voltage divider ratio for the third node so as to be dependent on the value of the short-circuit resistance of the defective capacitor prevents damage to the non-defective capacitor for extremely varied values of short-circuit resistance of the defective capacitor.

The invention is advantageous particularly when the buffer circuit has a plurality of series circuits each including two buffer capacitors of the type described, in which the potential node located between the buffer capacitors is either connected to a separate additional circuit or is in each case connected to the third potential node of the first series circuit. As a result, all of the series circuits are influenced by only one additional circuit. Even if the buffering capacity of one of the series circuits is restricted due to a defect in one of its buffer capacitors, the remaining series circuits can then ensure the buffering of the supply voltage virtually without any restriction.

Other features which are considered as characteristic for the invention are set forth in the appended claims.

Although the invention is illustrated and described herein as embodied in a buffer circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
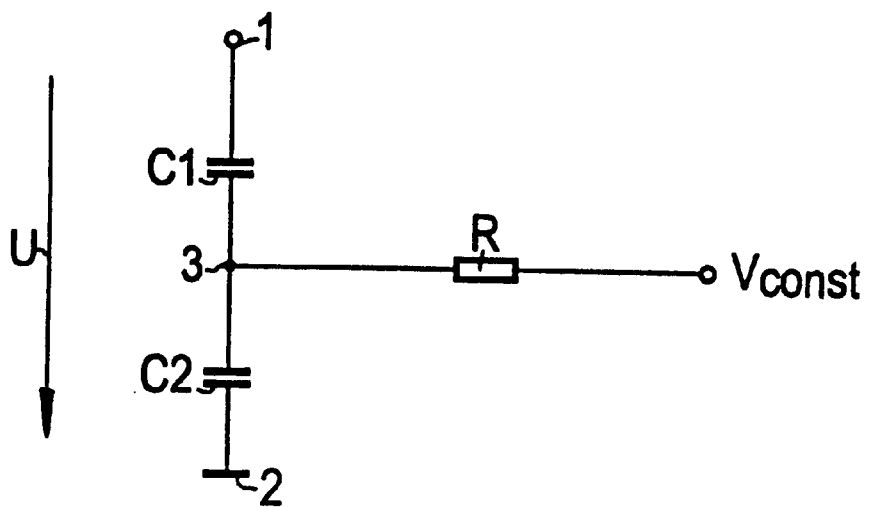
FIGS. 1 to 4 are schematic diagrams of different exemplary embodiments of a buffer circuit according to the invention.

Referring now to the figures of the drawings in detail and first, particularly, to FIG. 1 thereof, there is seen a first exemplary embodiment of a buffer circuit according to the invention, in which a first potential node 1 is connected to a second potential node 2 through a first buffer capacitor C1 and a second buffer capacitor C2. A supply voltage U of an integrated circuit is dropped between the first and second potential nodes 1, 2. The supply voltage U is to be buffered and the illustrated buffer circuit is part of the integrated circuit. A third potential node 3 is disposed between the two capacitors C1, C2 and is connected through a non-reactive resistor R to a constant potential $V_{const}$. The second potential node 2 is at ground potential. The constant potential $V_{const}$ can be derived from the supply voltage U, for example. It ensures, together with the resistor R, that the potential at the third potential node 3 only varies within certain limits when there is a defect in one of the two capacitors C1, C2. The potential established at the third potential node 3 in the event of a defect results from a ratio of a voltage divider which is formed by the resistor R and a short-circuit resistance of the defective capacitor. The value of the resistor R is dimensioned in such a way that it and a typical value for the short-circuit resistance of the capacitor together yield the desired voltage divider ratio. Typical values for short-circuit resistances of defective capacitors can be ascertained empirically.

Without the additional circuit according to the invention, in the event of a defect in one of the capacitors, having a short-circuit resistance which is then very much smaller than the (ideally) infinite resistance of the other, intact capacitor, almost the entire supply voltage U would be dropped across the intact capacitor. In that case, the potential of the third potential node 3 would approximate the potential of one of the two potential nodes 1, 2 to a very great extent. The intact capacitor, across which virtually the entire supply voltage U would then be dropped, would then be destroyed by the high electric field strength associated therewith. That is avoided in the case of the invention by virtue of influencing the potential at the third potential node.

Figure 2:
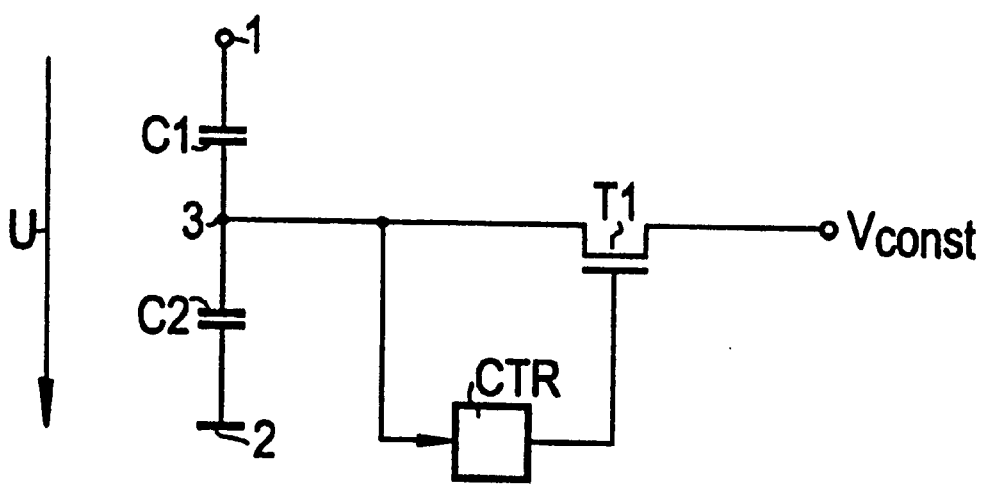

FIG. 2 shows a second exemplary embodiment of the buffer circuit, which differs from that of FIG. 1 in that the non-reactive resistor R is replaced by an n-channel transistor T1, having a gate which is connected to an output of a voltage regulator CTR. An input of the voltage regulator CTR is connected to the third potential node 3. The voltage regulator CTR regulates the potential at the third potential node 3 by varying the resistance of the n-channel transistor T1. As a result, its potential has virtually the same value as in the case of intact capacitors when there is a defect in one of the capacitors C1, C2. The effect achieved by the regulation of the potential of the third potential node 3 is that the voltage dropped across the intact capacitor of the two capacitors C1, C2 is independent of the state of the other capacitor, with the result that it is not likewise destroyed. The supply voltage U to be buffered does not collapse, by virtue of the fact that when there is a defect in one of the two capacitors, the respective other capacitor is prevented from being destroyed. Therefore, the integrated circuit can continue to be operated despite the buffer circuit being impaired.

The supply voltage U can still be adequately buffered where a defect has occurred if, in addition to the series circuit including the two capacitors C1, C2 as illustrated in the figures, a plurality of further identical series circuits are connected in parallel with the former series circuit. In the case of the further series circuits a potential node located between the capacitors is connected to the third potential node 3. If only one of the two capacitors of one of the series circuits is then defective, the remaining series circuits provide their service unimpaired to the greatest possible extent due to the maintenance of the potential at the third potential node 3.

Figure 3:
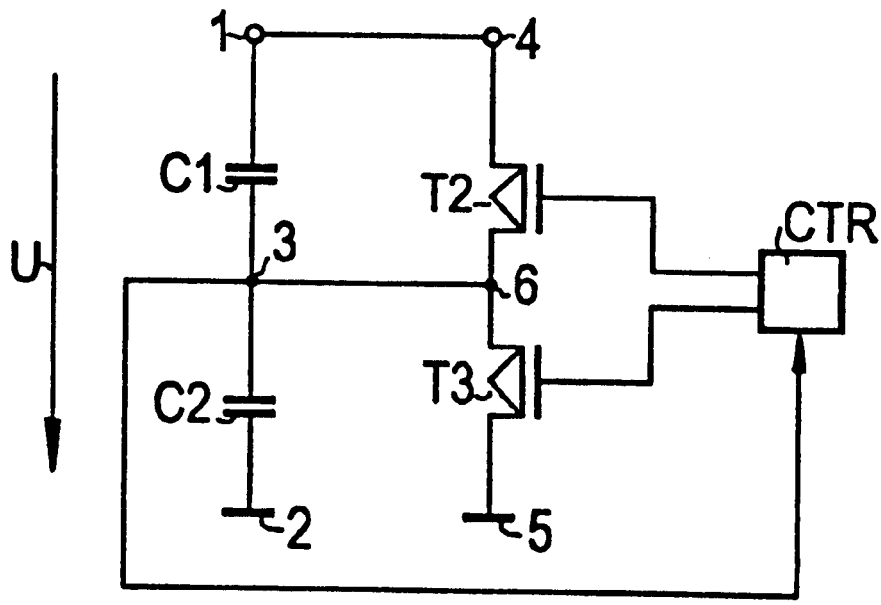

FIG. 3 shows a third exemplary embodiment of the invention, in which a series circuit including two transistors T2, T3, that form a voltage divider, is disposed between a fourth potential node 4 and a fifth potential node 5. A sixth potential node 6 disposed between the transistors T2, T3 is connected to the third potential node 3. If a constant voltage is then dropped between the fourth potential node 4 and the fifth potential node 5, the potential at the third potential node 3 is determined to the greatest possible extent from a voltage divider ratio of the two transistors T2, T3. In this case, the supply voltage U to be buffered can be used as the constant voltage. As a result, as shown in FIG. 3, the first potential node is electrically connected to the fourth potential node and the second potential node is electrically connected to the fifth potential node. The voltage divider ratio in FIG. 3 can be varied by a voltage regulator CTR through the gates of the transistors T2, T3. That voltage regulator, in an analogous manner to FIG. 2, again regulates the potential at the third potential node 3 by varying the voltage divider ratio. In other embodiments of the invention, it is also possible for just one of the two transistors T2, T3 to have its resistance varied by the voltage regulator CTR.

Figure 4:
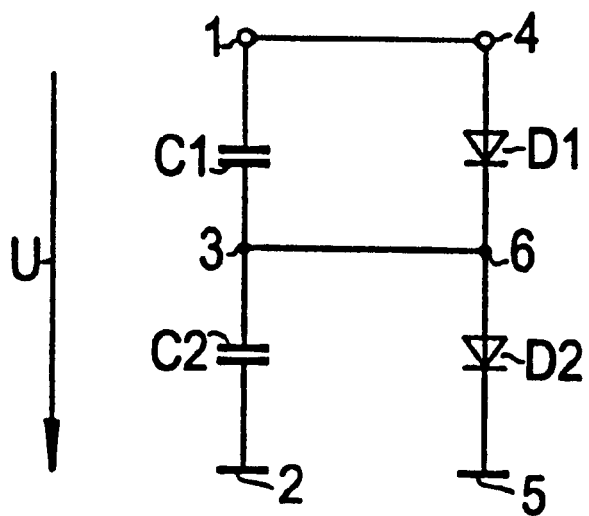

FIG. 4 shows a fourth exemplary embodiment of the invention, in which, by comparison with FIG. 3, no voltage regulator CTR is present, and the transistors T2, T3 have been replaced by diodes D1, D2. The potential at the third potential node 3 then results from a voltage divider ratio of the two diodes. It is also possible to use non-reactive resistors, instead of diodes or transistors, for forming the voltage divider. The method of operation of the circuit of FIG. 4 is similar to that of FIG. 1.

What is claimed is:

1. A buffer circuit for buffering a supply voltage of an integrated circuit, comprising:

two potential nodes between which a supply voltage drops;

a series circuit disposed between said two potential nodes, a said series circuit having at least two buffer capacitors and a third potential node disposed between said buffer capacitors; and an additional circuit connected to said third potential node for influencing a potential at said third potential node to not exceed at least one of an upper and a lower limit value upon occurrence of a leakage current through one of said capacitors, said additional circuit being a non-reactive resistor connecting said third potential node to a substantially constant potential.

2. A buffer circuit for buffering a supply voltage of an integrated circuit, comprising:

two potential nodes between which a supply voltage drops;

a series circuit disposed between said two potential nodes, said series circuit having at least two buffer capacitors and a third potential node disposed between said buffer capacitors;

an additional circuit connected to said third potential node for influencing a potential at said third potential node to not exceed at least one of an upper and a lower limit value upon occurrence of a leakage current through one of said capacitors, said additional circuit having:

a resistance element having a resistance and connecting said third potential node to a substantially constant potential; and a voltage regulator regulating the potential at said third potential node by varying said resistance, said voltage regulator having an input connected to said third potential node and an output for controlling said resistance.

3. A buffer circuit for buffering a supply voltage of an integrated circuit, comprising:

two potential nodes between which a supply voltage drops;

a series circuit disposed between said two potential nodes, said series circuit having at least two buffer capacitors and a third potential node disposed between said buffer capacitors;

an additional circuit connected to said third potential node for influencing a potential at said third potential node to not exceed at least one of an upper and a lower limit value upon occurrence of a leakage current through one of said capacitors;

fourth and fifth potential nodes;

said additional circuit having a voltage divider disposed between said fourth and fifth potential nodes and across which a substantially constant voltage drops; and said voltage divider including two resistance elements and a sixth potential node disposed between said two resistance elements and connected to said third potential node.

4. The buffer circuit according to claim 3, wherein said additional circuit also has a voltage regulator regulating the potential at said third potential node by varying a resistance of at least one of said resistance elements.

5. The buffer circuit according to claim 3, wherein said fourth potential node is connected to said first potential node.

6. The buffer circuit according to claim 3, wherein said fifth potential node is connected to said second potential node.

7. The buffer circuit according to claim 3, wherein said fourth potential node is connected to said first potential node and said fifth potential node is connected to said second potential node.

8. The buffer circuit according to claim 4, wherein said fourth potential node is connected to said first potential node.

9. The buffer circuit according to claim 4, wherein said fifth potential node is connected to said second potential node.

10. The buffer circuit according to claim 4, wherein said fourth potential node is connected to said first potential node and said fifth potential node is connected to said second potential node.

* * * * *